United States Patent
Yang

(10) Patent No.: US 9,245,596 B1
(45) Date of Patent: Jan. 26, 2016

(54) LOW POWER CONSUMPTION CHARGE PUMP SYSTEM AND ASSOCIATED CONTROL CIRCUIT AND METHOD FOR NON-VOLATILE MEMORY CELL ARRAY

(71) Applicant: eMemory Technology Inc., Hsin-Chu (TW)

(72) Inventor: Cheng-Te Yang, Taichung (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 0 days.

(21) Appl. No.: 14/539,201

(22) Filed: Nov. 12, 2014

Related U.S. Application Data

(60) Provisional application No. 62/021,216, filed on Jul. 7, 2014.

(51) Int. Cl.
| G11C 7/00 | (2006.01) |
| G11C 5/14 | (2006.01) |
| H02M 3/07 | (2006.01) |

(52) U.S. Cl.
CPC ........ *G11C 5/145* (2013.01); *H02M 3/07* (2013.01)

(58) Field of Classification Search
USPC .................................. 365/189.11, 226, 227
See application file for complete search history.

(56) References Cited

U.S. PATENT DOCUMENTS

| 5,319,604 | A  | * | 6/1994  | Imondi  | G11C 5/145 365/189.11 |
| 5,708,604 | A  | * | 1/1998  | Fontana | G11C 8/08 365/189.11 |
| 7,372,739 | B2 | * | 5/2008  | Macerola | G11C 16/30 365/189.11 |
| 7,443,735 | B2 |   | 10/2008 | Pan | |
| 7,948,300 | B2 | * | 5/2011  | Ryoo | H02M 3/07 365/226 |
| 8,547,754 | B2 |   | 10/2013 | Ha | |

* cited by examiner

*Primary Examiner* — Trong Phan
(74) *Attorney, Agent, or Firm* — WPAT, PC; Justin King

(57) ABSTRACT

A charge pump system includes a logic circuit, a signal processing circuit, a charge pump circuit, a switching circuit, a first controllable discharge path, and a second controllable discharge path. The logic circuit receives a program enabling signal and generates a first control signal. The signal processing circuit receives a pump enabling signal, and generates a second control signal and a third control signal. The charge pump circuit receives the third control signal and generates an output signal. The switching circuit has a control terminal receiving the third control signal, a first terminal connected with the output terminal of the charge pump circuit, and a second terminal connected with a reservoir capacitor. The first controllable discharge path receives the first control signal, and the second controllable discharge path receives the second control signal.

20 Claims, 4 Drawing Sheets

US 9,245,596 B1

LOW POWER CONSUMPTION CHARGE PUMP SYSTEM AND ASSOCIATED CONTROL CIRCUIT AND METHOD FOR NON-VOLATILE MEMORY CELL ARRAY

This application claims the benefit of U.S. provisional patent application No. 62/021,216, filed Jul. 7, 2014, the subject matter of which is incorporated herein by reference.

FIELD OF THE INVENTION

The present invention relates to a charge pump system and associated control method, and more particularly to a charge pump system and associated control method for a non-volatile memory cell array.

BACKGROUND OF THE INVENTION

Generally, a non-volatile memory comprises a memory cell array. The memory cell array consists of plural memory cells. In addition, each memory cell has a charge storage device, such as floating gate transistor or SONOS transistor, etc.

During a program cycle of a non-volatile memory, a high voltage is received by the memory cell array. Consequently, hot carriers are injected into the floating gate of the floating gate transistor of a selected memory cell. Generally, the high voltage received by the memory cell array is provided by a charge pump circuit.

For example, if no hot carriers are injected into the floating gate, the memory cell has a first storing state (e.g. the state "1"). Whereas, if the hot carriers are injected into the floating gate, the memory cell has a second storing state (e.g. the state "0").

FIG. 1 is a schematic circuit diagram illustrating the relationship between a charge pump circuit and a memory cell array according to the prior art. An enabling terminal En of the charge pump circuit 110 receives a program enabling signal En-pgm. An output terminal O of the charge pump circuit 110 is connected with a decouple capacitor C and the memory cell array 120. Moreover, a controller (not shown) of the non-volatile memory may issue the program enabling signal En-pgm to determine a program cycle.

When the program enabling signal En-pgm is activated, the program cycle is started. Meanwhile, an output signal Vout with a high voltage (e.g. 15V) is outputted from an output terminal O of the charge pump circuit 110 to the memory cell array 120. The decouple capacitor C may reduce the overshoot voltage and the ripple voltage of the output signal Vout.

Moreover, when the program enabling signal En-pgm is inactivated, the program cycle is ended. Meanwhile, the output signal Vout from the output terminal O of the charge pump circuit 110 is changed to a low voltage (e.g. a ground voltage).

As mentioned above, during the program cycle, the memory cell array 120 receives the high voltage to program the selected memory cell. However, if the output signal Vout is maintained at the high voltage, the programming efficiency of the memory cell array 120 is deteriorated.

SUMMARY OF THE INVENTION

The present invention provides a charge pump system for a memory cell array.

During a program cycle, the output signal of the charge pump system is alternately switched between a high voltage and a low voltage. That is, during the program cycle, the selected memory cell of the memory cell array may receive plural rising edges of the output signal. Consequently, the programming efficiency is enhanced.

An embodiment of the present invention provides a charge pump system. The charge pump system is connected with a memory cell array and a reservoir capacitor. The charge pump system includes a logic circuit, a signal processing circuit, a charge pump circuit, a switching circuit, a first controllable discharge path, and a second controllable discharge path. The logic circuit receives a program enabling signal. The logic circuit generates a first control signal according to a program cycle corresponding to the program enabling signal. The signal processing circuit receives a pump enabling signal, and generates a second control signal and a third control signal. The second control signal is activated by the signal processing circuit during a disabling period of the third control signal. An enabling terminal of the charge pump circuit receives the third control signal. An output terminal of the charge pump circuit generates an output signal. The output terminal of the charge pump circuit is connected with the memory cell array. A control terminal of the switching circuit receives the third control signal. A first terminal of the switching circuit is connected with the output terminal of the charge pump circuit. A second terminal of the switching circuit is connected with a first terminal of the reservoir capacitor. A second terminal of the reservoir capacitor is connected with a ground voltage. A control terminal of the first controllable discharge path receives the first control signal. A first terminal of the first controllable discharge path is connected with the second terminal of the switching circuit. A second terminal of the first controllable discharge path is connected with the ground voltage. A control terminal of the second controllable discharge path receives the second control signal. A first terminal of the second controllable discharge path is connected with the output terminal of the charge pump circuit. A second terminal of the second controllable discharge path is connected with a first voltage.

Another embodiment of the present invention provides a control method for a charge pump system. The charge pump system comprises a charge pump circuit with an output terminal connected to a memory cell array, a first controllable discharge path connected to the output terminal of the charge pump circuit, and a switching circuit connected between the reservoir capacitor and the output terminal of the charge pump circuit, the control method. During a program cycle, in an enable period the first controllable discharge path is in a open-circuit state, and the switching circuit is controlled in a close-circuit state to connect the reservoir capacitor with the output terminal of the charge pump circuit, and the charge pump circuit is enabled to generate a first voltage to the memory cell array and to charge the reservoir capacitor. And in a disable period, the switching circuit is controlled in the open-circuit state to disconnect the reservoir capacitor with the output terminal of the charge pump circuit, the charge pump circuit is disabled, and the first controllable discharge path is controlled in the close-circuit state to discharge the output terminal of the charge pump circuit to a second voltage and to maintain the first voltage on the reservoir capacitor.

Another embodiment of the present invention provides a controlling method for a charge pump system. The charge pump system comprises a charge pump circuit with an output terminal connected to a memory cell array, a switching circuit connected with a reservoir capacitor and the output terminal of the charge pump circuit. Firstly, the reservoir capacitor is charged when a program cycle starts, the charge pump circuit is also enabled and the switching circuit is in a close-circuit state. After that the charge pump circuit is disabled and the switching circuit is in an open-circuit state which results that charges of the reservoir capacitor is maintained. When the charge pump circuit is enabled again and the switching circuit is in the close-circuit state, the charges of the reservoir capacitor are shared with the memory cell array. The charge pump is disabled and enabled repeatedly until the program cycle ends. The reservoir capacitor is also discharged when the program cycle ends.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Generally, in the transient period of receiving the high voltage (i.e. at the rising edge of the signal), the number of hot carriers injected into the floating gate is the largest. The present invention provides a charge pump system. During a program cycle, the output signal of the charge pump system is alternately switched between a high voltage and a low voltage. That is, during the program cycle, the selected memory cell of the memory cell array may receive plural rising edges of the output signal. Consequently, the programming efficiency is enhanced.

Figure 2:
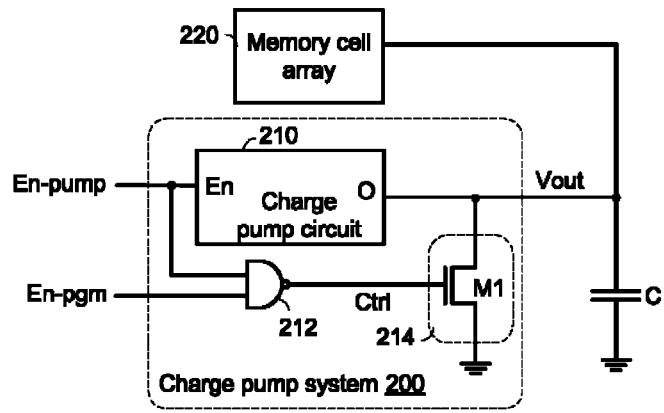
FIG. 2 is a schematic circuit diagram illustrating a charge pump system according to a first embodiment of the present invention.
Figure 2:
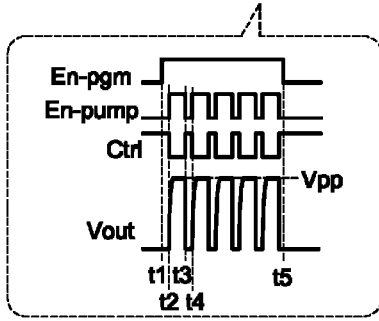

FIG. 2 is a schematic circuit diagram illustrating a charge pump system according to a first embodiment of the present invention. A controller (not shown) of a non-volatile memory may issue a program enabling signal En-pgm to determine a program cycle and issues a pump enabling signal En-pump to control the frequency of an output signal Vout. Moreover, the output signal Vout is outputted from an output terminal O of the charge pump system 200 to a reservoir capacitor C and a memory cell array 220.

The charge pump system 200 comprises a charge pump circuit 210, a controllable discharge path 214, and a NAND gate 212. An enabling terminal En of the charge pump circuit 210 receives the pump enabling signal En-pump. The output signal Vout is outputted from the output terminal O of the charge pump circuit 210. Moreover, a first input terminal of the NAND gate 212 receives the pump enabling signal En-pump, a second input terminal of the NAND gate 212 receives the program enabling signal En-pgm, and an output terminal of the NAND gate 212 generates a control signal Ctrl. Moreover, the controllable discharge path 214 comprises a transistor M1. A first terminal of the transistor M1 is connected with the output terminal O of the charge pump circuit 210, a second terminal of the transistor M1 is connected with a ground voltage, and a control terminal of the transistor M1 receives the control signal Ctrl.

The timing waveforms of the associated signals processed by the charge pump system 200 will be illustrated as follows.

At the time point t1, the program enabling signal En-pgm is activated (e.g. in a high level state), and the program cycle is started. At the time point t2, the pump enabling signal En-pump is in the high level state and the control signal Ctrl is in a low level state. Meanwhile, the charge pump circuit 210 is enabled. Under this circumstance, a high voltage Vpp (e.g. 15V) is generated, and the controllable discharge path 214 is in an open-circuit state. Consequently, the output signal Vout is charged to the high voltage Vpp.

At the time point t3, the pump enabling signal En-pump is in the low level state and the control signal Ctrl is in the high level state. Meanwhile, the charge pump circuit 210 is disabled. Consequently, the controllable discharge path 214 is in a close-circuit state, the output signal Vout is discharged to the ground voltage.

In other words, the high-level period of the pump enabling signal En-pump is an enabling period of the charge pump circuit 210, and the output signal Vout is charged to the high voltage Vpp during the enabling period of the charge pump circuit 210. On the other hand, the low-level period of the pump enabling signal En-pump is a disabling period of the charge pump circuit 210, and the output signal Vout is discharged to the ground voltage during the disabling period of the charge pump circuit 210.

Similarly, after the time point t4, the level states of the pump enabling signal En-pump and the control signal Ctrl are continuously and periodically switched. As a consequence, the magnitude of the output signal Vout is alternately switched between the high voltage Vpp and the ground voltage.

At the time point t5, the program enabling signal En-pgm is inactivated (e.g. in the low level state), and the program cycle is ended.

From the above descriptions, during the program cycle, the output signal Vout of the charge pump system 200 is alternately switched between the high voltage and the low voltage. That is, during the program cycle, the selected memory cell of the memory cell array 220 may receive plural rising edges of the output signal Vout. Consequently, the programming efficiency is enhanced.

However, the charge pump system 200 still has a drawback. For example, when the controllable discharge path 214 is in the close-circuit state, the charges of the reservoir capacitor C is discharged. Consequently, whenever the output signal Vout of the charge pump system 200 is changed from the ground voltage to the high voltage Vpp, the reservoir capacitor C should be charged again. Under this circumstance, the power consumption is increased.

Figure 3:
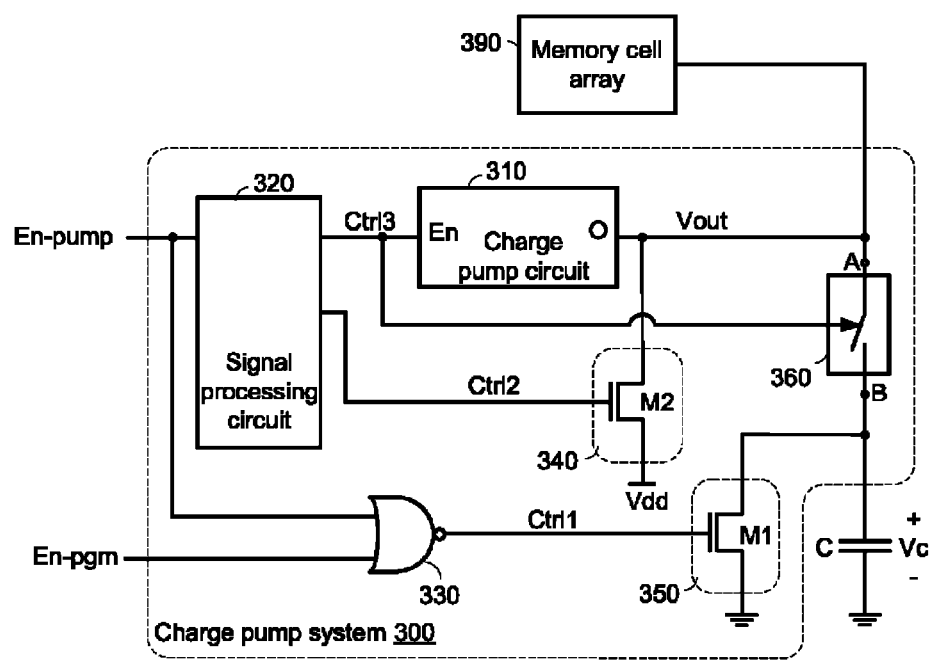
FIG. 3 is a schematic circuit diagram illustrating a charge pump system according to a second embodiment of the present invention.

FIG. 3 is a schematic circuit diagram illustrating a charge pump system according to a second embodiment of the present invention. A controller (not shown) of a non-volatile memory may issue a program enabling signal En-pgm to determine a program cycle and issues a pump enabling signal En-pump to control the frequency of an output signal Vout.

The charge pump system 300 comprises a charge pump circuit 310, a signal processing circuit 320, a first controllable discharge path 350, a second controllable discharge path 340, a NOR gate 330, and a switching circuit 360.

A first input terminal of the NOR gate 330 receives the pump enabling signal En-pump. A second input terminal of the NOR gate 330 receives the program enabling signal En-pgm. An output terminal of the NOR gate 330 generates a first control signal Ctrl.

The signal processing circuit 320 receives the pump enabling signal En-pump, and generates a second control signal Ctrl2 and a third control signal Ctrl3. Since the third control signal Ctrl3 is correlated with the pump enabling signal En-pump, the frequency of the third control signal Ctrl3 is identical to the frequency of the pump enabling signal En-pump. Moreover, during a disabling period of the third control signal Ctrl3 (e.g. the low level state), the second control signal Ctrl2 is activated by the signal processing circuit 320.

An enabling terminal En of the charge pump circuit 310 receives the third control signal Ctrl3. The output signal Vout is outputted from the output terminal O of the charge pump circuit 310. Moreover, the output terminal O of the charge pump circuit 310 is connected with a memory cell array 390.

A control terminal of the switching circuit 360 receives the third control signal Ctrl3. A first terminal A of the switching circuit 360 is connected with the output terminal O of the charge pump circuit 310. Moreover, a reservoir capacitor C is arranged between a second terminal B of the switching circuit 360 and a ground voltage.

Moreover, the first controllable discharge path 350 comprises a transistor M1. A control terminal of the transistor M1 receives the first control signal Ctrl1. A first terminal of the transistor M1 is connected with the second terminal B of the switching circuit 360. A second terminal of the transistor M1 is connected with the ground voltage. During the program cycle, the first controllable discharge path 350 is in an open-circuit state. During the non-program cycle, the first controllable discharge path 350 is in a close-circuit state. Consequently, in another embodiment, the first controllable discharge path 350 is only controlled according to the program enabling signal En-pgm. Under this circumstance, the NOR gate 330 is replaced by a NOT gate. The input terminal of the NOT gate receives the program enabling signal En-pgm. The output terminal of the NOT gate is connected with the control terminal of the first controllable discharge path 350.

The second controllable discharge path 340 comprises a transistor M2. A control terminal of the transistor M2 receives the second control signal Ctrl2. A first terminal of the transistor M2 is connected with the output terminal O of the charge pump circuit 310. A second terminal of the transistor M2 is connected with a low voltage Vdd (e.g. 2V).

From the above descriptions, during the program cycle, the output signal Vout of the charge pump system 300 is alternately switched between the high voltage Vpp (e.g. 15V) and the low voltage Vdd. Moreover, when the magnitude of the output signal Vout is reduced to the low voltage Vdd, the switching circuit 360 is in an open-circuit state. Consequently, the charges in the reservoir capacitor C will be retained and not discharged. It is noted that the magnitude of the low voltage Vdd is not restricted. For example, in another embodiment, the magnitude of the low voltage Vdd is equal to the ground voltage.

Figure 4:
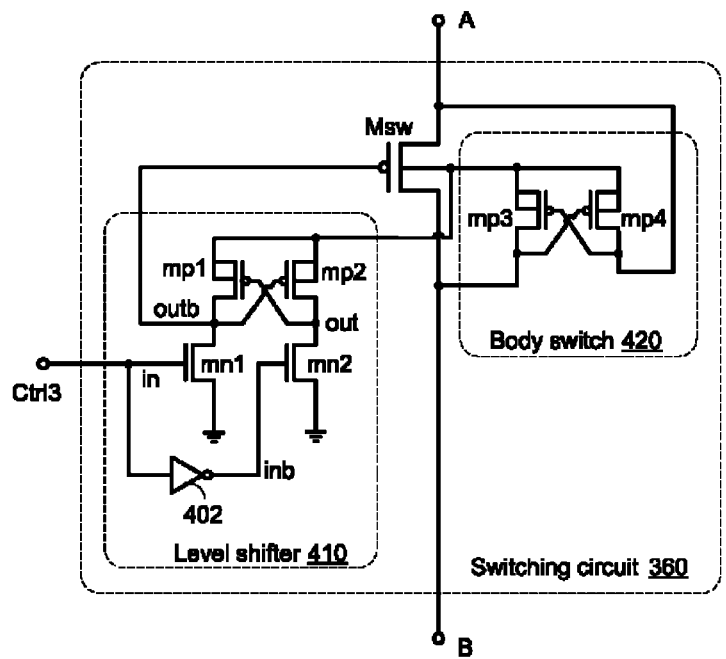
FIG. 4 is a schematic circuit diagram illustrating an exemplary switching circuit used in the charge pump system of FIG. 3.

FIG. 4 is a schematic circuit diagram illustrating an exemplary switching circuit used in the charge pump system of FIG. 3. In this embodiment, the switching circuit 360 is a high voltage switching circuit. As shown in FIG. 4, the switching circuit 360 comprises a switch transistor Msw, a level shifter 410, and a body switch 420.

A first source/drain terminal of the switch transistor Msw is the first terminal A of the switching circuit 360. A second source/drain terminal of the switch transistor Msw is the second terminal B of the switching circuit 360.

The level shifter 410 comprises a NOT gate 402 and transistors mn1, mn2, mp1 and mp2. An input terminal of the NOT gate 402 is connected with an input terminal (in) of the level shifter 410. An output terminal of the NOT gate 402 is connected with an inverted input terminal (inb) of the level shifter 410. The gate terminal of the transistor mn1 is connected with the input terminal of the NOT gate 402 and receives the third control signal Ctrl3. The source terminal of the transistor mn1 is connected with the ground voltage. The drain terminal of the transistor mn1 is connected with an inverted output terminal (outb) of the level shifter 410. The gate terminal of the transistor mn2 is connected with the output terminal of the NOT gate 402. The source terminal of the transistor mn2 is connected with the ground voltage. The drain terminal of the transistor mn2 is connected with an output terminal (out) of the level shifter 410. A source terminal and a body terminal of the transistor mp1 are connected with a body terminal of the switch transistor Msw. A drain terminal of the transistor mp1 is connected with the inverted output terminal (outb) of the level shifter 410. The gate terminal of the transistor mp1 is connected with the output terminal (out) of the level shifter 410. A source terminal and a body terminal of the transistor mp2 are connected with the body terminal of the switch transistor Msw. A drain terminal of the transistor mp2 is connected with the output terminal (out) of the level shifter 410. The gate terminal of the transistor mp2 is connected with the inverted output terminal (outb). Moreover, the inverted output terminal (outb) of the level shifter 410 is further connected with the gate terminal of the switch transistor Msw.

The body switch 420 comprises two transistors mp3 and mp4. A first source/drain terminal and a body terminal of the transistor mp3 are connected with the body terminal of the switch transistor Msw. A second source/drain terminal of the transistor mp3 is connected with the second terminal B of the switching circuit 360. The gate terminal of the transistor mp3 is connected with the first terminal A of the switching circuit 360. A first source/drain terminal and a body terminal of the transistor mp4 are connected with the body terminal of the switch transistor Msw. A second source/drain terminal of the transistor mp4 is connected with the first terminal A of the switching circuit 360. The gate terminal of the transistor mp4 is connected with the second terminal B of the switching circuit 360.

The operations of the switching circuit 360 will be illustrated as follows. When the third control signal Ctrl3 is in the high level state, the gate terminal of the switch transistor Msw receives the ground voltage from the level shifter 410. Consequently, the switch transistor Msw is in a close-circuit state. Moreover, since the voltage at the first terminal A of the switching circuit 360 is higher than the voltage at the second terminal B of the switching circuit 360, the transistor mp4 is turned on. Under this circumstance, the body terminal of the switch transistor Msw is connected with the first terminal A of the switching circuit 360.

When the third control signal Ctrl3 is in the low level state, the gate terminal of the switch transistor Msw receives a high voltage level from the level shifter 410. Consequently, the switch transistor Msw is in an open-circuit state. Moreover, since the voltage at the first terminal A of the switching circuit 360 is lower than the voltage at the second terminal B of the switching circuit 360, the transistor mp3 is turned on. Under this circumstance, the body terminal of the switch transistor Msw is connected with the second terminal B of the switching circuit 360.

Figure 5:
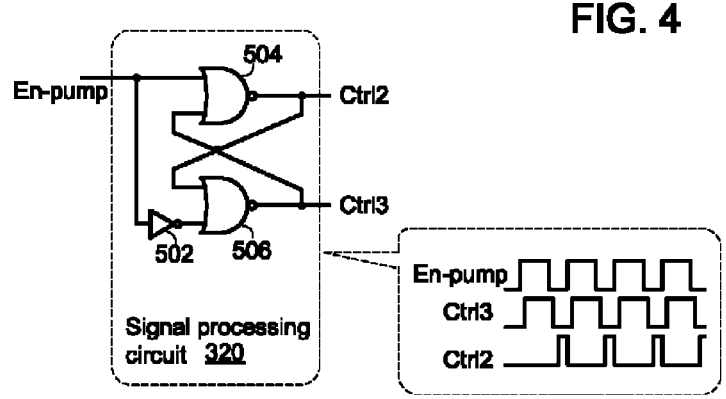
FIG. 5 is a schematic circuit diagram illustrating an exemplary signal processing circuit used in the charge pump system of FIG. 3.

FIG. 5 is a schematic circuit diagram illustrating an exemplary signal processing circuit used in the charge pump system of FIG. 3. In this embodiment, the signal processing circuit 320 is a non-overlapping circuit. As shown in FIG. 5, the signal processing circuit 320 comprises a NOT gate 502, a first NOR gate 504 and a second NOR gate 506. An input terminal of the NOT gate 502 is connected with a first input terminal of the first NOR gate 504. An output terminal of the NOT gate 502 is connected with a first input terminal of the second NOR gate 506. The first input terminal of the first NOR gate 504 receives the pump enabling signal En-pump. A second input terminal of the first NOR gate 504 is connected with an output terminal of the second NOR gate 506. An output terminal of the first NOR gate 504 generates the second control signal Ctrl2. A second terminal of the second NOR gate 506 is connected with the output terminal of the first NOR gate 504. The output terminal of the second NOR gate 506 generates the second control signal Ctrl3.

As shown in FIG. 5, the signal processing circuit 320 receives the pump enabling signal En-pump, and generates the second control signal Ctrl2 and the third control signal Ctrl3. The signal edges of the second control signal Ctrl2 and the signal edges of the third control signal Ctrl3 are not aligned with each other. Moreover, during the disabling period of the third control signal Ctrl3 (e.g. the low level state), the second control signal Ctrl2 is activated by the signal processing circuit 320.

Figure 6:
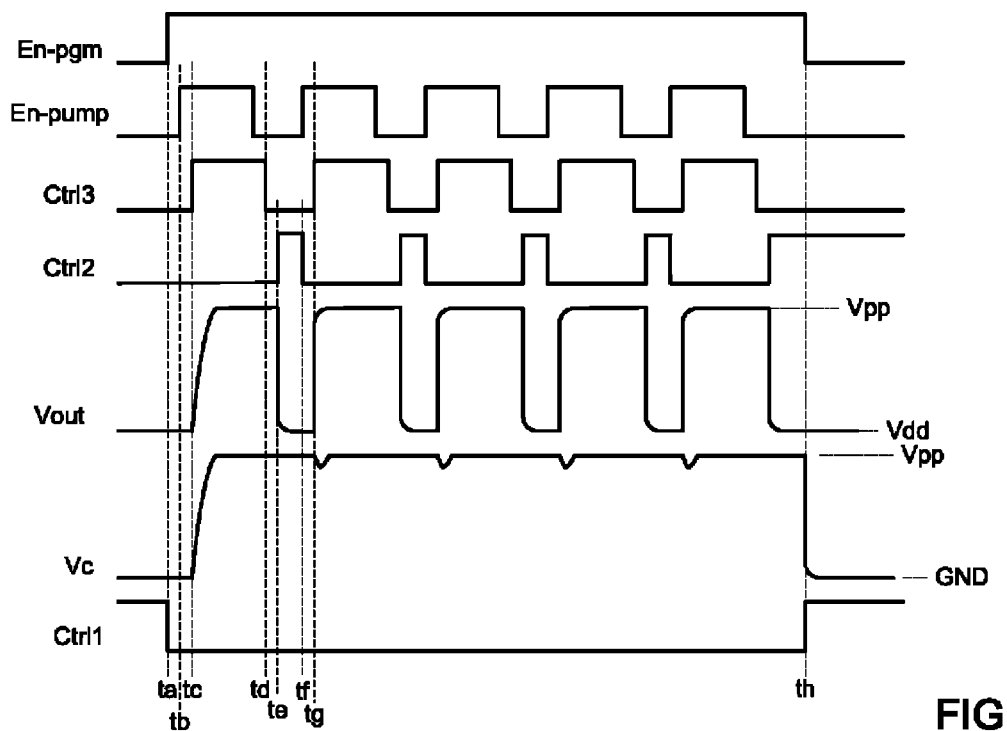
FIG. 6 is a schematic timing waveform diagram illustrating associated signal processed by the charge pump system of FIG. 3.

FIG. 6 is a schematic timing waveform diagram illustrating associated signal processed by the charge pump system of FIG. 3. According to the present invention, the charge pump circuit 310 is enabled in the enable period when the third control signal Ctrl3 is in the high level state; and the charge pump circuit 310 is disabled in the disable period when the third control signal Ctrl3 is in the low level state.

At the time point ta, the program enabling signal En-pgm is activated (e.g. in the high level state), and the program cycle is started. Moreover, the first control signal Ctrl1 is in the low level state, and the first controllable discharge path 350 is in the open-circuit state.

At the time point tb, the pump enabling signal En-pump is in the high level state. In addition, the pump enabling signal En-pump is processed by the signal processing circuit 320. After a delay time interval between the time point tb and the time point tc, the second control signal Ctrl2 and the third control signal Ctrl3 are generated.

At the time point tc, the third control signal Ctrl3 is in the high level state, and the second control signal Ctrl2 is in the low level state. Meanwhile, the charge pump circuit 310 is firstly enabled, the switching circuit 360 is in the close-circuit state, and the second controllable discharge path 340 is in the open-circuit state. Consequently, the charge pump circuit 310 generates a high voltage Vpp (e.g. 15V) to charge the reservoir capacitor C. Moreover, the output signal Vout is charged to the high voltage Vpp.

At the time point td, the third control signal Ctrl3 is in the low level state, and the second control signal Ctrl2 is in the low level state. Meanwhile, the charge pump circuit 310 is disabled, the switching circuit 360 is in the open-circuit state, and the second controllable discharge path 340 is in the open-circuit state. Consequently, the output signal Vout is maintained at the high voltage Vpp, and the voltage Vc of the reservoir capacitor C is also maintained at the high voltage Vpp.

At the time point te, the third control signal Ctrl3 is in the low level state, and the second control signal Ctrl2 is in the high level state. Meanwhile, the charge pump circuit 310 is disabled, the switching circuit 360 is in the open-circuit state, and the second controllable discharge path 340 is in the close-circuit state. Consequently, the output signal Vout is discharged to a low voltage Vdd, and the voltage Vc of the reservoir capacitor C is also maintained at the high voltage Vpp.

At the time tf, the third control signal Ctrl3 is in the low level state, and the second control signal Ctrl2 is in the low level state. Meanwhile, the charge pump circuit 310 is disabled, the switching circuit 360 is in the open-circuit state, and the second controllable discharge path 340 is in the open-circuit state. Consequently, the output signal Vout is maintained at the low voltage Vdd, and the voltage Vc of the reservoir capacitor C is also maintained at the high voltage Vpp.

At the time point tg, the third control signal Ctrl3 is in the high level state, and the second control signal Ctrl2 is in the low level state. Meanwhile, the charge pump circuit 310 is enabled, the switching circuit 360 is in the close-circuit state, and the second controllable discharge path 340 is in the open-circuit state. Consequently, the output signal Vout is charged to the high voltage Vpp again. While the output signal Vout is increased to the high voltage Vpp, since the charges stored in the reservoir capacitor C are connected with the output terminal O of the output signal Vout, the output signal Vout can be quickly increased to the high voltage Vpp resulting from charges sharing of the reservoir capacitor C.

As shown in FIG. 6, when the reservoir capacitor C is connected to the output terminal O of the charge pump circuit 310 at the time point tg, charges on the reservoir capacitor firstly shares with the memory cell array and then the reservoir capacitor is charged to the high voltage Vpp again by the charge pump circuit 310. Therefore, the voltage Vc of the reservoir capacitor C is slightly lower down and then returned to the high voltage Vpp, when the reservoir capacitor C is connected to the output terminal O of the charge pump circuit 310 at the time point tg.

Similarly, after the time point tg, the level states of the second control signal Ctrl2 and the third control signal Ctrl3 are continuously and periodically switched. As a consequence, the magnitude of the output signal Vout is alternately switched between the high voltage Vpp and the low voltage Vdd. In addition, the voltage Vc of the reservoir capacitor C is slightly changed with respect to the high voltage Vpp.

At the time point th, both of the program enabling signal En-pgm and the pump enabling signal En-pump are inactivated (e.g. in the low level state). Meanwhile, the first control signal Ctrl1 is in the high level state, and the first controllable discharge path 350 is in the close-circuit state. Consequently, the charges of the reservoir capacitor C are discharged to the ground voltage, and the program cycle is ended.

From the above descriptions, during the program cycle, the output signal Vout of the charge pump system 300 is alternately switched between the high voltage and the low voltage. That is, during the program cycle, the selected memory cell of the memory cell array 390 may receive plural rising edges of the output signal Vout. Consequently, the programming efficiency is enhanced.

Figure 1:
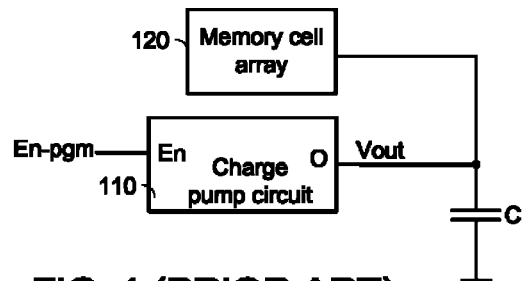
FIG. 1 (prior art) is a schematic circuit diagram illustrating the relationship between a charge pump circuit and a memory cell array according to the prior art.

It is to be noted that in order to achieve a better performance of the charge pump system, the value of the reservoir capacitor C needs to be set at least 20% of total memory array capacitive loading and preferably more than 50% of total memory array capacitive loading. The higher the ratio to array loading, the more power consumption can be save when the output signal Vout switching between Vpp and Vdd. Besides, the reservoir capacitor C can be replace by the decouple capacitor C as shown in FIG. 1.

Moreover, when the magnitude of the output signal Vout is reduced to the low voltage Vdd, the switching circuit 360 is in an open-circuit state. Consequently, the charges in the reservoir capacitor C are retained. In addition, while the output signal Vout is increased to the high voltage Vpp, since the charges stored in the reservoir capacitor C are connected with the output terminal O of the output signal Vout, the output signal Vout can be quickly increased to the high voltage Vpp. Consequently, the power consumption is minimized.

In other words, during the program cycle, the charges retained in the reservoir capacitor C is shared with the charge pump circuit when the charge pump circuit is enabled such that output signal Vout is developed to the high voltage Vpp very quickly. The power consumption of the charge pump system is thus reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A charge pump system connected with a memory cell array and a reservoir capacitor, the charge pump system comprising:
    a logic circuit receiving a program enabling signal, wherein the logic circuit generates a first control signal according to a program cycle corresponding to the program enabling signal;
    a signal processing circuit receiving a pump enabling signal, and generating a second control signal and a third control signal, wherein the second control signal is activated by the signal processing circuit during a disabling period of the third control signal;
    a charge pump circuit, wherein an enabling terminal of the charge pump circuit receives the third control signal, and an output terminal of the charge pump circuit generates an output signal, wherein the output terminal of the charge pump circuit is connected with the memory cell array;
    a switching circuit, wherein a control terminal of the switching circuit receives the third control signal, a first terminal of the switching circuit is connected with the output terminal of the charge pump circuit, and a second terminal of the switching circuit is connected with a first terminal of the reservoir capacitor, wherein a second terminal of the reservoir capacitor is connected with a ground voltage;
    a first controllable discharge path, wherein a control terminal of the first controllable discharge path receives the first control signal, a first terminal of the first controllable discharge path is connected with the second terminal of the switching circuit, and a second terminal of the first controllable discharge path is connected with the ground voltage; and
    a second controllable discharge path, wherein a control terminal of the second controllable discharge path receives the second control signal, a first terminal of the second controllable discharge path is connected with the output terminal of the charge pump circuit, and a second terminal of the second controllable discharge path is connected with a first voltage.

2. The charge pump system as claimed in claim 1, wherein during the program cycle, the first controllable discharge path is in an open-circuit state according to the first control signal, wherein during a non-program cycle, the first controllable discharge path is in a close-circuit state according to the first control signal.

3. The charge pump system as claimed in claim 2, wherein the logic circuit is a NOT gate, wherein an input terminal of the NOT gate receives the program enabling signal, and an output terminal of the NOT gate generates the first control signal.

4. The charge pump system as claimed in claim 2, wherein the logic circuit is NOR gate, wherein a first input terminal of the NOR gate receives the pump enabling signal, a second input terminal of the NOR gate receives the program enabling signal, and an output terminal of the NOR gate generates the first control signal.

5. The charge pump system as claimed in claim 1, wherein during an enabling period of the third control signal, the charge pump circuit generates a second voltage, wherein the second voltage is higher than the first voltage, wherein during the disabling period of the third control signal, the charge pump circuit is disabled.

6. The charge pump system as claimed in claim 5, wherein during the enabling period of the third control signal, the switching circuit is in the close state, wherein during the disabling period of the third control signal, the switching circuit is in the open-circuit state.

7. The charge pump system as claimed in claim 6, wherein when the second control signal is activated, the second controllable discharge path is in the close-circuit state, wherein when the second control signal is inactivated, the second controllable discharge path is in the open-circuit state.

8. The charge pump system as claimed in claim 7, wherein when the second controllable discharge path is in the open-circuit state and the switching circuit is in the close-circuit state, a voltage of the reservoir capacitor is charged to the second voltage, and the output signal has the second voltage.

9. The charge pump system as claimed in claim 7, wherein when the second controllable discharge path is in the close-circuit state and the switching circuit is in the open-circuit state, a voltage of the reservoir capacitor is maintained at the second voltage, and the output voltage is discharged to the first voltage.

10. The charge pump system as claimed in claim 1, wherein the first controllable discharge path comprises a transistor, wherein a gate terminal of the transistor receives the first control signal, a drain terminal of the transistor is connected with the second terminal of the switching circuit, and a source terminal of the transistor is connected with the ground voltage.

11. The charge pump system as claimed in claim 1, wherein the second controllable discharge path comprises a transistor, wherein a gate terminal of the transistor receives the second control signal, a drain terminal of the transistor is connected with the output terminal of the charge pump circuit, and a source terminal of the transistor is connected with the first voltage.

12. The charge pump system as claimed in claim 1, wherein the signal processing circuit comprises:
    a NOT gate having an input terminal and an output terminal;

a first NOR gate, wherein a first input terminal of the first NOR gate is connected with the input terminal of the NOT gate and receives the pump enabling signal, a second input terminal of the first NOR gate receives the second control signal, and an output terminal of the first NOR gate generates the third control signal; and a second NOR gate, wherein a first input terminal of the second NOR gate is connected with the output terminal of the NOT gate, a second input terminal of the second NOR gate receives the third control signal, and an output terminal of the second NOR gate generates the second control signal.

13. The charge pump system as claimed in claim 1, wherein the switching circuit comprises:

a switch transistor comprising a gate terminal, a body terminal, a first source/drain terminal and a second source/drain terminal, wherein the first source/drain terminal of the switch transistor is connected with the output terminal of the charge pump circuit, and the second source/drain terminal of the switch transistor is connected with the first terminal of the reservoir capacitor;

a level shifter, wherein an input terminal of the level shifter receives the third control signal, and an inverted output terminal of the level shifter is connected with the gate terminal of the switch transistor; and a body switch connected with the body terminal, the first source/drain terminal and the second source/drain terminal of the switch transistor, wherein when the switching circuit is in the close-circuit state, the body terminal of the switch transistor is connected with the first source/drain terminal, wherein when the switching circuit is in the open-circuit state, the body terminal of the switch transistor is connected with the second source/drain terminal.

14. The charge pump system as claimed in claim 13, wherein the level shifter comprises:

a NOT gate comprising an input terminal and an output terminal, wherein the input terminal of the NOT gate is connected with the input terminal of the level shifter;

a first transistor, wherein a gate terminal of the first transistor is connected with the input terminal of the NOT gate, a source terminal of the first transistor is connected with the ground voltage, and a drain terminal of the first transistor is connected with the inverted output terminal of the level shifter;

a second transistor, wherein a gate terminal of the second transistor is connected with the output terminal of the NOT gate, a source terminal of the second transistor is connected with the ground voltage, and a drain terminal of the transistor is connected with an output terminal of the level shifter;

a third transistor, wherein a source terminal and a body terminal of the third transistor are connected with the body terminal of the switch transistor, a drain terminal of the third transistor is connected with the inverted output terminal of the level shifter, and a gate terminal of the third transistor is connected with the output terminal of the level shifter; and a fourth transistor, wherein a source terminal and a body terminal of the fourth transistor are connected with the body terminal of the switch transistor, a drain terminal of the fourth transistor is connected with the output terminal of the level shifter, and a gate terminal of the fourth transistor is connected with the inverted output terminal of the level shifter.

15. The charge pump system as claimed in claim 14, wherein the body switch comprises:

a fifth transistor, wherein a first source/drain terminal and a body terminal of the fifth transistor are connected with the body terminal of the switch transistor, a second source/drain terminal of the fifth transistor is connected with the second source/drain terminal of the switch transistor, and a gate terminal of the fifth transistor is connected with the first source/drain terminal of the switch transistor; and a sixth transistor, wherein a first source/drain terminal and a body terminal of the sixth transistor are connected with the body terminal of the switch transistor, a second source/drain terminal of the sixth transistor is connected with the first source/drain terminal of the switch transistor, and a gate terminal of the sixth transistor is connected with the second source/drain terminal of the switch transistor.

16. A control method for a charge pump system, wherein the charge pump system comprises a charge pump circuit with an output terminal connected to a memory cell array, a first controllable discharge path connected to the output terminal of the charge pump circuit, and a switching circuit connected between a reservoir capacitor and the output terminal of the charge pump circuit, the control method comprising steps of:

during a program cycle, controlling the first controllable discharge path in a open-circuit state, controlling the switching circuit in a close-circuit state to connect the reservoir capacitor with the output terminal of the charge pump circuit, and enabling the charge pump circuit to generate a first voltage to the memory cell array and to charge the reservoir capacitor in an enable period; and during the program cycle, controlling the switching circuit in the open-circuit state to disconnect the reservoir capacitor with the output terminal of the charge pump circuit, disabling the charge pump circuit, and controlling the first controllable discharge path in the close-circuit state to discharge the output terminal of the charge pump circuit to a second voltage and to maintain the first voltage on the reservoir capacitor in a disable period.

17. The control method as claimed in claim 16, wherein the charge pump system further comprises a second controllable discharge path connected to the reservoir capacitor and the control method further comprising steps of: controlling the second controllable discharge path in the open-circuit state during the program cycle, and controlling the second controllable discharge path in the close-circuit state to discharging the reservoir capacitor to a ground voltage after the program cycle.

18. The control method as claimed in claim 16, further comprising step of: sharing the charges of the reservoir capacitor with the memory cell array when the charge pump circuit is enabled and the switching circuit is in the close-circuit state.

19. An controlling method for a charge pump system which comprises a charge pump circuit with an output terminal connected to a memory cell array, a switching circuit connected with a reservoir capacitor and the output terminal of the charge pump circuit, the control method comprising steps of:

charging the reservoir capacitor when a program cycle starts, wherein the charge pump circuit is firstly enabled and the switching circuit is in a close-circuit state;

maintaining charges of the reservoir capacitor when the charge pump circuit is disabled and the switching circuit is in an open-circuit state;

sharing the charges of the reservoir capacitor with the memory cell array when the charge pump circuit is enabled and the switching circuit is in the close-circuit state;

repeating the maintaining step and the sharing step until the program cycle is ended; and discharging the reservoir capacitor after the program cycle.

20. The control method for the charge pump system as claimed in claim 19, further comprises a step of charging the reservoir capacitor after the sharing step.

* * * * *